(12) United States Patent
Lin et al.

(10) Patent No.: US 6,369,428 B2
(45) Date of Patent: Apr. 9, 2002

(54) POLYSILICON LOAD FOR 4T SRAM OPERATING AT COLD TEMPERATURES

(75) Inventors: Jyh-Feng Lin, Hua-Lien; Kwan-Jen Chu, Kaohsiung; Yi-Pin Shen, Yuin-Lin; Jer-Yuan Sheu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/804,390

(22) Filed: Mar. 13, 2001

Related U.S. Application Data

(62) Division of application No. 09/300,047, filed on Apr. 27, 1999, now Pat. No. 6,238,993.

(51) Int. Cl.$^7$ .............................................. H01L 23/62
(52) U.S. Cl. ...................................... 257/359; 438/382
(58) Field of Search ................................ 257/154, 516, 257/536, 538, 359, 363; 438/171, 190, 210, 238, 330, 382

(56) References Cited

U.S. PATENT DOCUMENTS

| | | | | |
|---|---|---|---|---|
| 3,577,038 A | * | 5/1971 | Cook, Jr. ..................... | 317/101 |
| 4,579,600 A | | 4/1986 | Shah et al. ................... | 148/1.5 |
| 4,622,856 A | | 11/1986 | Binder et al. ................ | 73/727 |
| 4,658,378 A | * | 4/1987 | Bourassa ..................... | 365/154 |
| 4,679,170 A | | 7/1987 | Bourassa et al. ............. | 365/154 |
| 5,172,211 A | | 12/1992 | Godinho et al. ............. | 257/536 |
| 5,187,559 A | * | 2/1993 | Isobe et al. .................. | 257/538 |
| 5,489,547 A | | 2/1996 | Erdeljac et al. .............. | 437/60 |

* cited by examiner

*Primary Examiner*—David Nelms
*Assistant Examiner*—Quoc Hoang
(74) *Attorney, Agent, or Firm*—George O. Saile; Stephen B. Ackerman

(57) ABSTRACT

This invention relates to the fabrication of integrated circuit devices and more particularly to a method for reducing the otherwise excessive negative TCR of low doped polysilicon load resistors in sub-micron, NMOS based, 4 transistor SRAM cells. The problem with a high negative TCR is that cell failures can occur as operating currents drop down too close to device leakage currents, when operating at cold temperatures. The key to this invention is a novel PN junction approach which causes polysilicon resistors to become electrically thicker at colder temperatures. A vertical PN junction is formed along the entire length of a polysilicon resistor and the temperature dependent space charge region of the PN junction is used for modulating the effective electrical thickness of the resistor. Consequently, the undesirable tendency for thermally activated grain boundary conduction to decrease with cold temperatures is partially compensated by a slight concurrent increase in resistor thickness. A method is described for fabricating such novel polysilicon load resistors, which can be used for operating 4T SRAMs at temperatures, as low as −45 C., while not appreciably adding to process or device complexity.

4 Claims, 5 Drawing Sheets

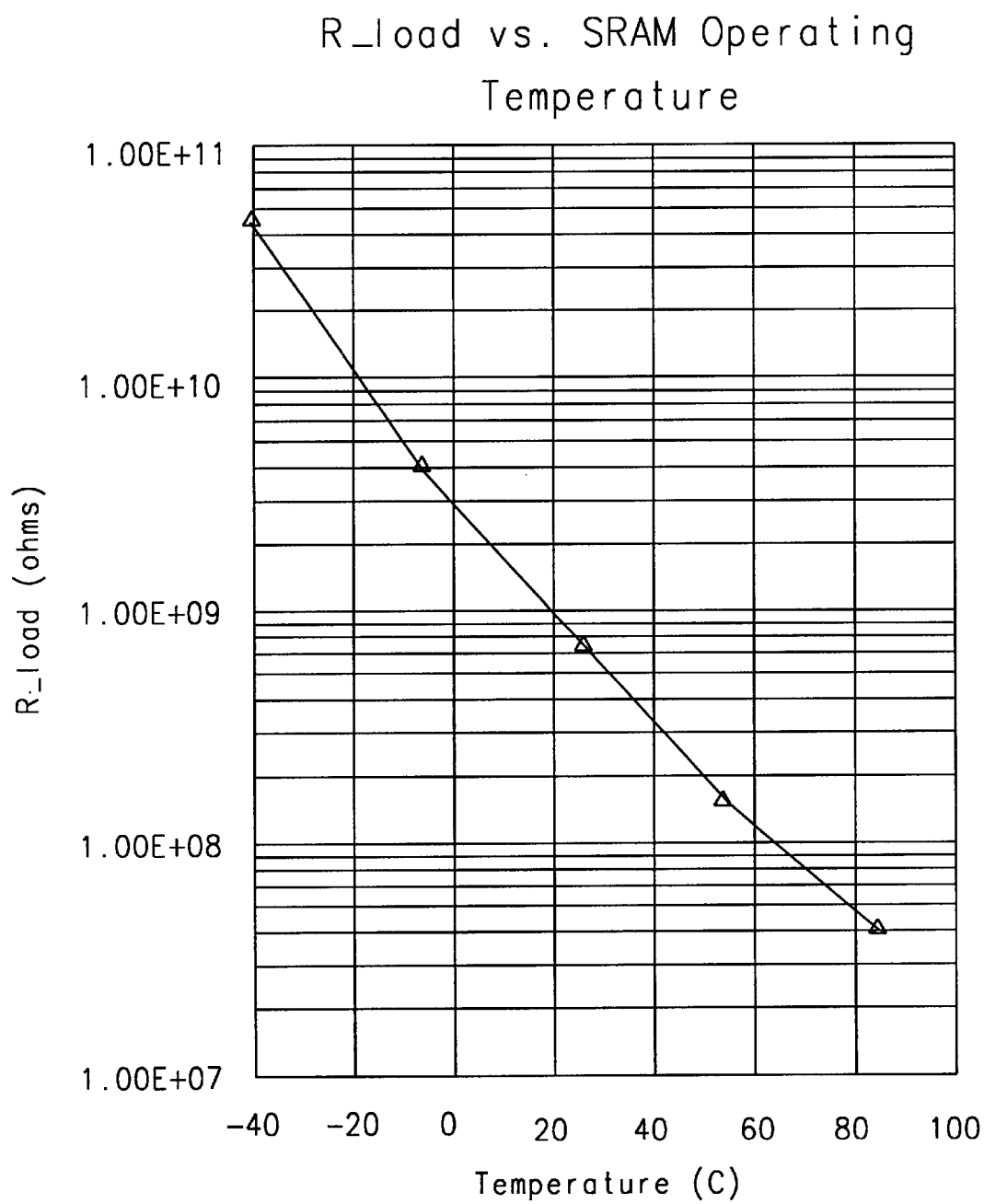
FIG. 1 - Prior Art

POLYSILICON LOAD FOR 4T SRAM OPERATING AT COLD TEMPERATURES

This is a division of U.S. patent application Ser. No. 09/300,047, filing date Apr. 27, 1999, now U.S. Pat. No. 6,238,993, Novel Polysilicon Load For 4T Sram Operating At Cold Temperatures, assigned to the same assignee as the present invention.

FIELD OF INVENTION

This invention relates to the fabrication of integrated circuit devices and more particularly to a method for reducing the undesirable high negative temperature coefficient of low doped polysilicon layers that are often used as the load resistors in Static Random Access Memory, SRAM, cells.

BACKGROUND OF THE INVENTION AND PRIOR ART

As the demand to push semiconductor device features deeper into the sub-micron range has increased, numerous techniques have been developed for increasing the performance and circuit density of Static Random Access Memories (SRAMs), while also minimizing power dissipation. Most SRAM cells are implemented as cross-coupled inverters, which, in contrast to Dynamic Random Access Memories (DRAMs), do not require periodic refreshing in order to preserve the stored data as long as circuit power is maintained. Primarily, each of the cross-coupled inverters usually consist of an active transistor and a load resistor. For full CMOS SRAMs, the active transistor is usually an N channel device and the effective load resistor is usually a P channel device. For MOS SRAM, the active transistor is usually an N channel device and the load resistor is usually formed from high resistivity polysilicon. For typical SRAM cells, the above examples of cross-coupled inverters are used for information storage and two additional transistors are used for writing and reading information to and from the cells. Consequently, depending on the type of load resistor that is used, an SRAM cell can be comprised of 4 or 6 transistors. Choosing a particular SRAM technology for a given application involves numerous considerations. For minimal low standby power, full CMOS SRAM implementations are usually preferred. However, for simplicity, small cell size, low process cost and good speed performance, MOS implementations, such as NMOS, are often preferred.

MOS SRMAs, using polysilicon load resistors, can be implemented on large single P wells, while minimizing cell size and process complexity that would, otherwise, be needed to electrically isolate N and P channel devices. This has led to considerable popularity of four transistor, NMOS, SRAM (4T SRAM) technology. Although 4T SRAMs offer a number of attractive features, techniques for managing the evolving trade-offs between some cell failure concerns and excessive power dissipation have been a challenge. While lower SRAM operating currents are desirable for minimizing power dissipation, there are constraints an how low the operating currents can be. For example, SRAM cell failures can occur if excessive leakage currents become comparable to the on-state currents of the cell. In addition, the stored capacitive charge in the cell needs to be sufficient for protection from soft error failures, due to alpha particles. This, in turn, dictates that the operating currents of the cell be high enough to still allow for rapidly switching the memory state of the cell. Due, in part, to some of the above considerations between cell failures and excessive power dissipation. SRAMs have tended to use some evolving optimum value of cell operating current, while employing a number of techniques to maintain the operating current in a fairly constant optimal range. For 4T SRAMs, undesirable variations in optimal operating current are usually due to variations in the polysilicon load resistors, where the temperature coefficient of resistance, TCR, is often of great concern. Polysilicon resistors tend to exhibit rather large negative TCR values, which can lead to the problem of insufficient cell operating currents at low temperatures, for example.

Polysilicon resistors, as a controlling factor of SRAM operating currents, have been the subject of considerable attention.

U.S. Pat. No. 4,579,600 to Shah, et. al., teaches a method for using a two step process to reduce the large thermally activated grain boundary contribution to polysilicon sheet resistance that is typically responsible for a high negative TCR. A short high temperature annealing step is used to increase grain size and, thereby, reduce the number of grain boundaries as well as to reduce charge trapping at the grain boundaries. An additional step is taught for incorporating ionic hydrogen in the grain boundaries, as a means of achieving a further reduction of grain boundary trap density. By minimizing the grain boundary contribution to a negative TCR, the positive TCR contribution from the bulk of the grains is, therefore, able to be relatively more significant. Consequently, proper adjustment of the above extra process steps can be used to achieve a near zero TCR value. While addressing the problem of high negative TCR's of polysilicon resistors, the time and expense for additional process steps may not always be compatible with manufacturing needs for an SRAM process.

U.S. Pat. No. 4,622,856 to Binder, et. al., teaches a method for obtaining precise polysilicon resistors, with low TCR values. High doping of the polysilicon is used to reduce the negative TCR contributed by the polysilicon grain boundaries, relative to the positive contribution to TCR from the bulk of the grains. Precision tailoring of the resultant polysilicon resistors is accomplished by laser trimming. However, the high level of polysilicon doping that is needed for reducing the negative TCR does not seem to be compatible with the need for very high valued polysilicon, SRAM, load resistors in the sub-gigaohm to high gigaohm range.

U.S. Pat. No. 4,579,600 to Bourassa, et. al., teaches a method for obtaining high valued polysilicon resistors, while minimizing an otherwise high negative TCR due to thermally activated grain boundaries. An additional masked ion implantation step is used to convert each polysilicon resistor line into two lateral disposed back-to-back PN junctions. The effective series resistance of the back-to-back diodes exhibits a much lower negative TCR than that of a uniformly doped polysilicon line with a comparable nominal resistor value. However, part of the cost for this benefit is an extra masking step and a minimum polysilicon resistor line length restriction for accommodating the photolithography ground rules associated with the additional masked, opposite conductivity, ion implant step.

U.S. Pat. No. 5,489,547 to Erdeljac, et. al., teaches a method for obtaining polysilicon resistors with moderate sheet resistance values and reduced values of negative TCR. An additional opposite conductivity ion implantation step is used to counter dope a previously ion implanted polysilicon resistor. The invention features the counter doping approach as a means of obtaining moderate polysilicon sheet resistance values without the need for additional process steps.

However, such moderate values of sheet resistance do not seem to be compatible with the need for high polysilicon load resistors in the low-high gigaohm range, for 4T SRAMs.

There remains a need for a solution to the problem of reducing the negative TCR of polysilicon resistors and by means of a method that adds very little additional cost or time to a conventional 4T SRAM process, for example. The present invention solves this problem by forming a shallow vertical PN junction between the surface and sub-surface of the entire length of a polysilicon resistor. It is believed that the resultant space charge region (SCR) of the PN junction tends to adjust the effective electrical thickness of the polysilicon resistor, such as to make it thicker at colder temperatures. The effect of the changing SCR width with temperature helps to compensate the tendency for the thermally activated barrier of the grain boundaries to increase polysilicon sheet resistance at colder temperatures. This is accomplished by using an ion implantation process to form a shallow P type layer on the surface of a uniformly doped N type polysilicon resistor.

SUMMARY OF THE INVENTION

A principle object of the present invention is to provide an effective and manufacturable method to reduce the otherwise excessively high negative TCR of low doped polysilicon load resistors in sub-micron, 4T SRAM cells, over a semiconductor substrate.

Another object of the present invention is to minimize the negative TCR of polysilicon resistors by a novel PN junction approach which causes the electrical thickness of polysilicon resistors to effectively become thicker at colder temperatures, well below room temperature.

A further and primary object of the invention is to provide a method for forming vertical PN junctions along the entire length of polysilicon resistors, in order to obtain a temperature dependent space charge region for modulating their effective electrical thickness and, thereby, minimizing undesirably high negative TCR values.

These objects are achieved by a fabrication method which uses a shallow boron implantation process to form a PN junction, in the vertical direction, along the length of a polysilicon layer that has already been uniformly doped with a lower concentration of N type impurities. This new method comprises the steps of: (a) forming a photographically defined polysilicon resistor over a semiconductor substrate, which may include butted contacts to underlying source-drain regions and underlying conductive polysilicon lines, (b) lightly doping the polysilicon resistor with a low dose arsenic implant, (c) passivating the polysilicon resistor with a thin CVD oxide layer, (d) implanting a shallow high doped boron layer down through the CVD oxide layer and into the top surface of the polysilicon resistor, (e) high temperature annealing to activate the formation of a shallow PN junction over the surface of the polysilicon resistor and then (f) forming one or more electrical contact via holes down to the resultant, low TCR, polysilicon resistor, followed by conventional processing for the completion of a sub-micron 4T SRAM circuit.

This invention provides a method for solving the problem of being able to operate 4T SRAMs at cold temperatures, as low as −40° C., while not appreciably adding to process complexity. This problem is mainly caused by the fact that polysilicon has two conduction components that exhibit opposing TCR behavior, namely: across grain boundaries and through grains. Conduction across grain boundaries is associated with a thermally activated barrier height, whereby the degree of conduction decreases with decreasing temperature. Conduction through the grains is controlled by the same temperature dependent free carrier, related, mobility physics as that for mono-crystalline silicon, whereby the degree of conduction increases with decreasing temperature. Accordingly, the grain boundary conduction exhibits a negative TCR and grain conduction exhibits a positive TCR. Unfortunately, in low doped polysilicon resistors, which is typical for conventional 4T SRAMs, the low doping causes the grain boundary barrier heights to be relatively high. Hence, the thermal behavior of grain boundary conduction tends to dominate over that of the grains. This high negative TCR problem is illustrated in FIG. 1, which shows a plot of polysilicon load resistance as a function of SRAM operating temperature, for the case of the prior art.

In order to compensate for the overriding high negative TCR of grain boundary conduction, the present invention creates a novel compensating effect by forming a shallow PN junction over the surface of the polysilicon resistor. It is believed that, for operation at cold temperatures, the temperature dependent width of the PN junction space charge region, SCR, appears to decrease. This, in turn, increases the effective electrical thickness of the polysilicon resistor. As shown in FIGS. 2a and 2b, this results in overall increased polysilicon conduction which helps to compensate for decreased grain boundary conduction. The above rationale for the behavior of polysilicon resistors, fabricated according to the present invention, does not seem to be consistent with what would be expected for single crystal silicon. However, the associated electrical results suggest that this, in effect, appears to be what is occurring. FIG. 2a shows plots of polysilicon load resistance vs SRAM operating temperature where the improvement, for two embodiments of the present invention, is compared to the behavior of the prior art. FIG. 2b is a normalized plot of the same data shown in FIG. 2a, where FIG. 2b shows that the present invention has reduced the TCR of the prior art by about a factor of two. As shown in FIGS. 2a and 2b, a substantial desired reduction in negative TCR is achieved with the present invention.

BRIEF DESCRIPTION OF THE DRAWINGS

In the accompanying drawings for a material part of this description, there is shown:

FIG. 1 illustrates the unacceptable high negative polysilicon TCR behavior that has been minimized by the present invention.

DESCRIPTION OF THE PREFERRED EMBODIMENTS

It is noted that the following preferred embodiments and associated figures are intended to be presented in a way that can be applied to the fabrication of a variety of MOS, Bipolar, BiCMOS or full CMOS device technologies that could employ high valued polysilicon resistors. However, in the interest of facilitating a description of these preferred embodiments, they will be explained in terms of being applied to an NMOS based, 4T SRAM technology.

Figure 2A:
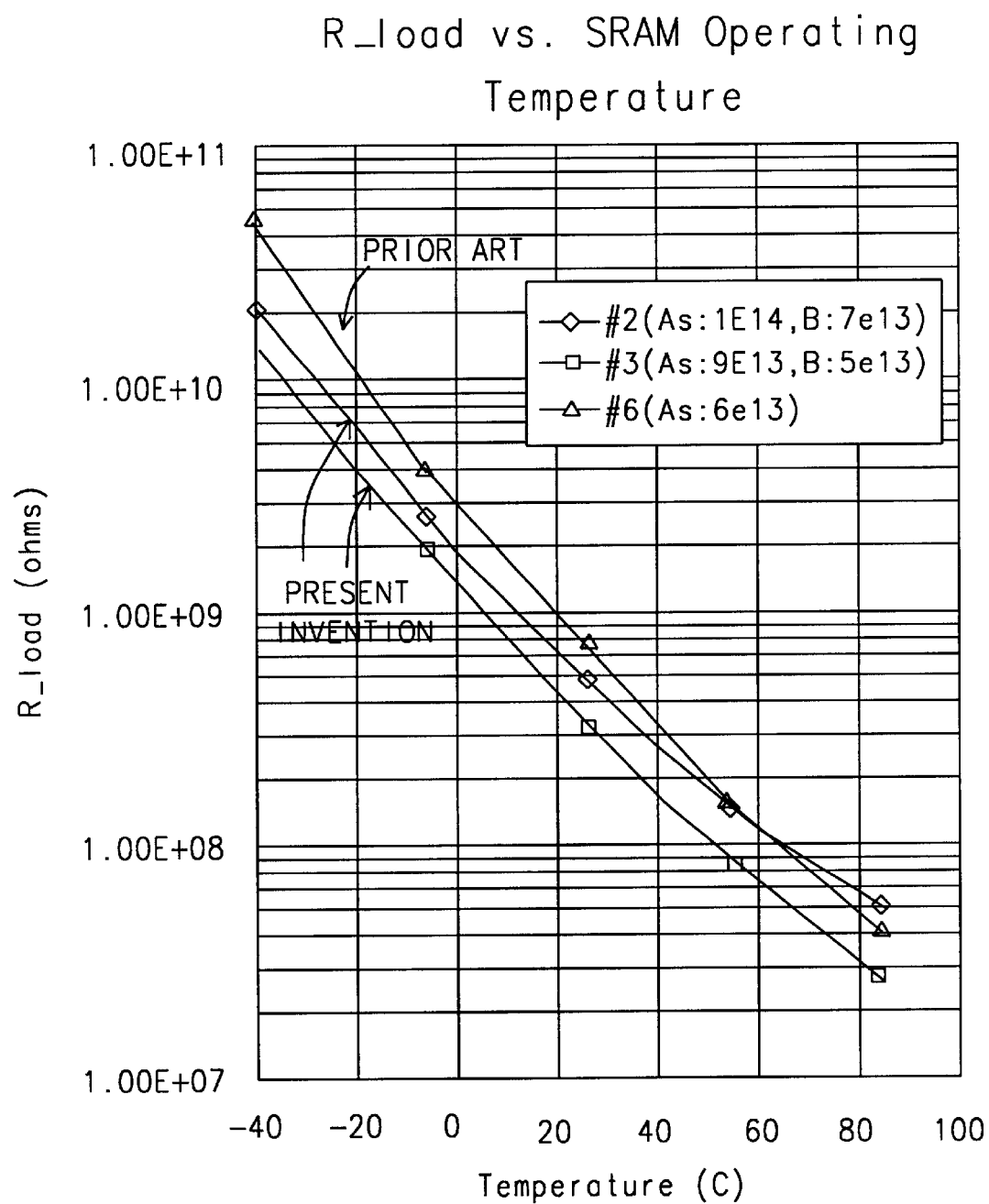
FIGS. 2a and 2b illustrate the substantial reduction in negative polysilicon TCR that is achieved by the present invention.
Figure 2B:
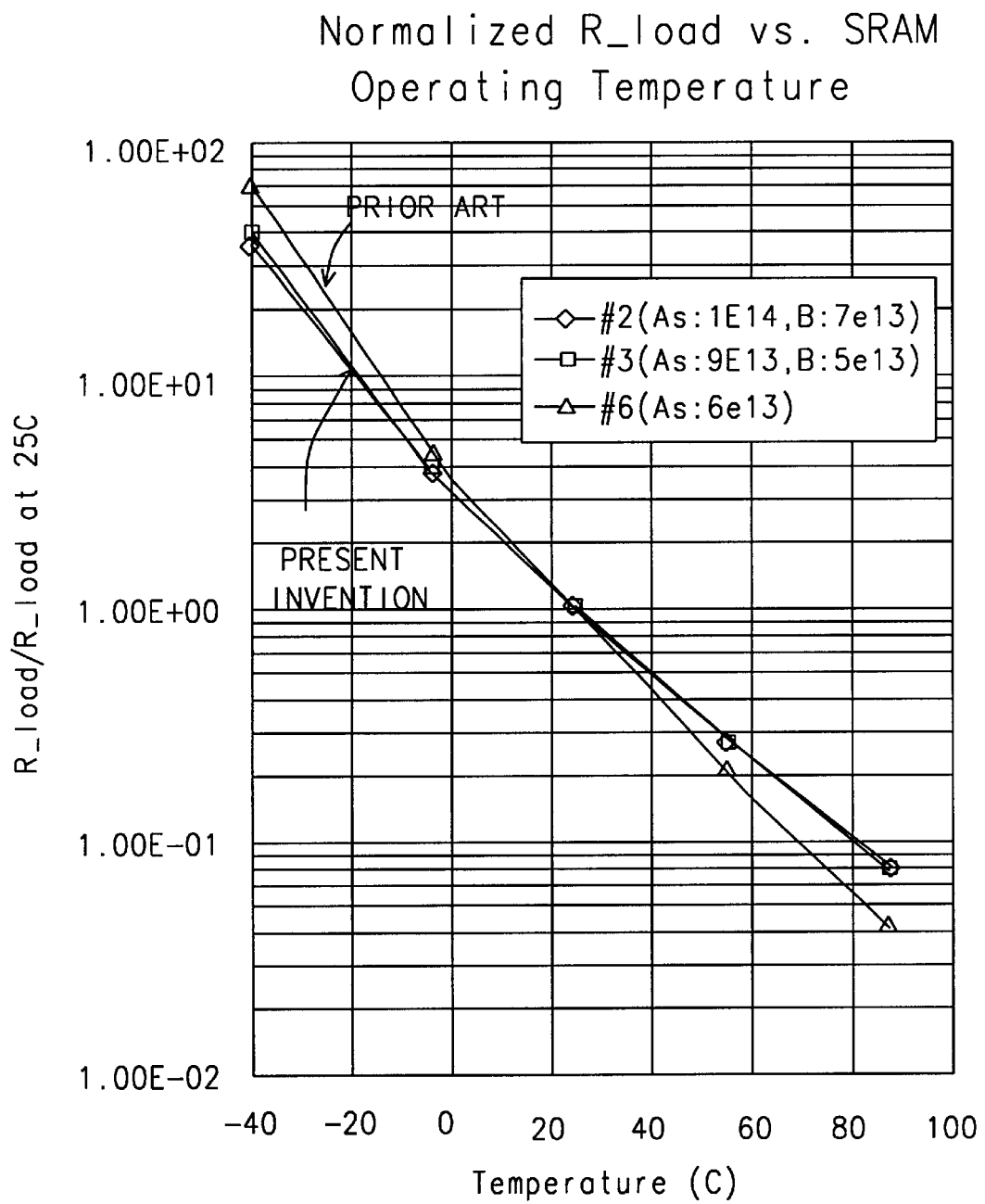
Figure 3:
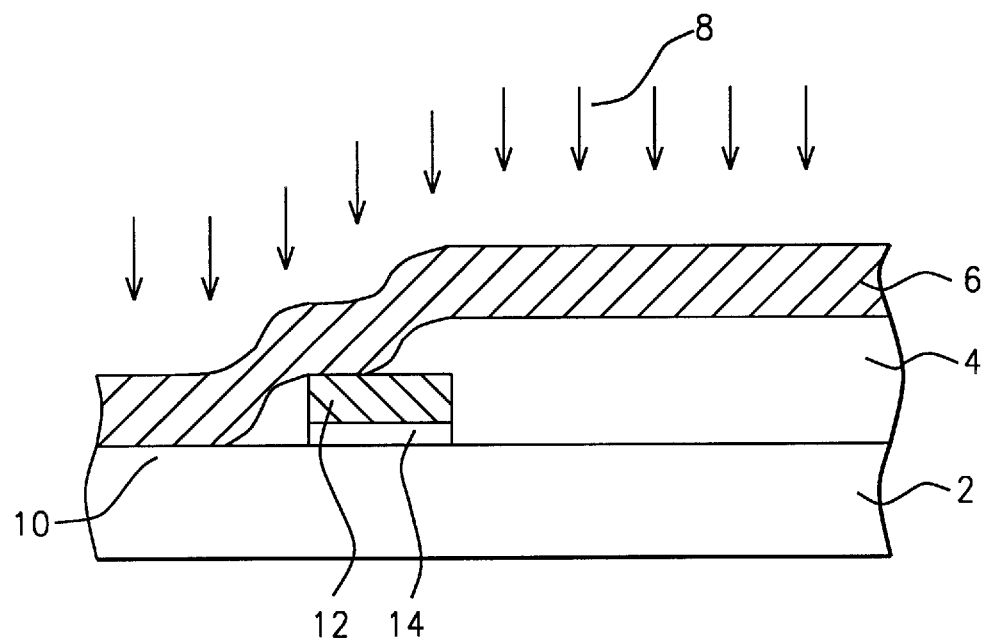
FIGS. 3 to 6 schematically illustrate in cross-sectional representation the preferred embodiments of the process of the present invention.

Referring now more particularly to FIG. 3, there is shown a portion of a partially completed integrated circuit for a 4T SRAM cell. A semiconductor substrate 2 is shown, over which an eventual novel polysilicon load resistor will be formed. Also shown, in FIG. 3, is an overlying insulating layer 4 and a further overlying layer of high resistivity N type polysilicon 6, which has been doped by a first ion implantation step B. Continuing to refer to FIG. 3, two examples of butted electrical contacts to the underside of said polysilicon layer 6 are illustrated. The first said example of a butted contact is to an underlying source or drain region 10 of an FET device. The second said example of a butted contact is to an underlying polysilicon layer 12, which is insulated from said substrate 2 by means of insulating region 14. Said insulating layer 4 could be a thermal oxide or an insulating stack consisting of thermal oxide and an overlying layer of CVD oxide, for example, and having a thickness range of about 1000 to 5000 angstroms. Said polysilicon layer 6 can be formed by means of chemical vapor deposition and grown to a thickness range of about 200 to 2000 angstroms. Said first ion implantation step 8 for said polysilicon layer 6 typically employs a relatively low dose range of about 1E13 to 1E14 arsenic, As, atoms/cm$^2$ and an energy range of about 30 to 60 KeV.

Figure 4:
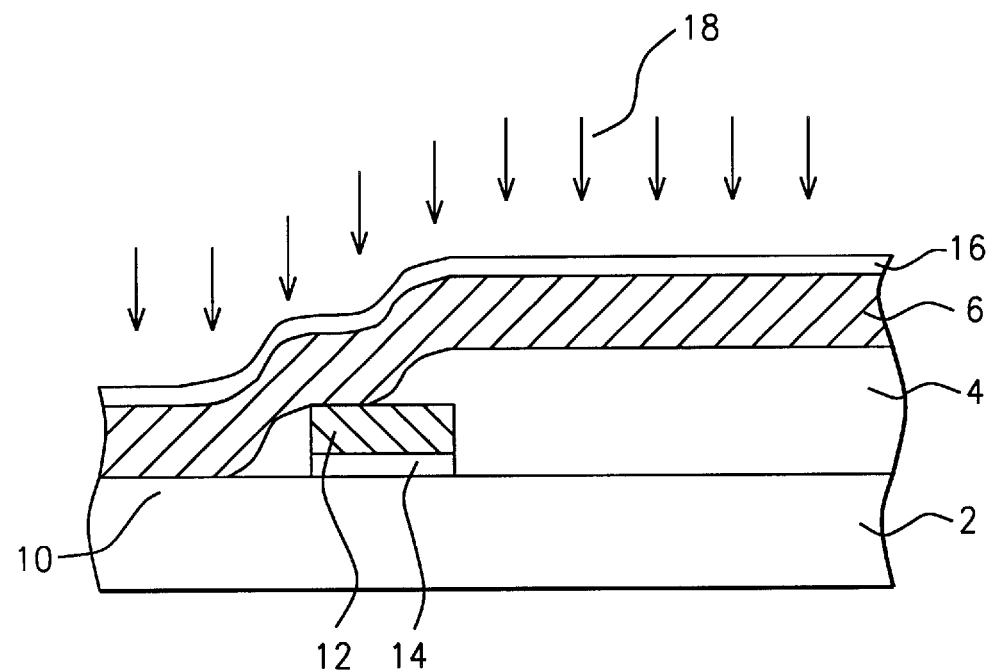

Referring now more particularly to FIG. 4, a thin layer of High density Undoped Silicate Glass, HUSG, 16 is next formed over said polysilicon layer 6 and then followed by second ion implantation step 18, which is used to convert the upper portion of said polysilicon layer 6 from N type to P type. The thickness of said HUSG, TEOS, layer 16 can be in the range of about 500 to 3000 angstroms and is typically formed by means of a low temperature (about 400 C.) plasma enhanced CVD process. Said second ion implantation step 18 typically employs a dose range of about 1E13 to 1E14 at/cm$^2$, of boron, and an energy range of about 30 to 60 KeV, where B as well as BF$_2$ have been used as dopant sources.

Figure 5:
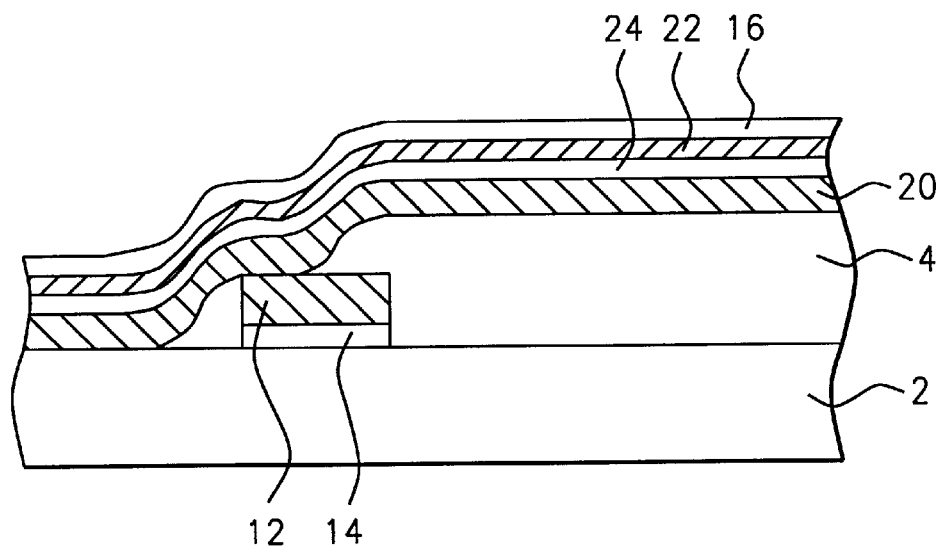

Referring now more particularly to FIG. 5, there is shown the result of having thermally activated the relatively uniform N type dopant from said first ion implant step 8 as well as the relatively shallow compensating P type dopant from said second ion implant step 18. Said polysilicon layer 6 is now composed of lower N type polysilicon region 20 and upper P type polysilicon region 22. Consequently, a vertical PN junction, along with an associated space charge region, SCR, 24 has now been formed within said original polysilicon layer 6.

Said space charge region 24 is the key to this invention. As previously discussed, its thermally dependent width is exploited to reduce the high undesirable negative TCR of lower N type polysilicon region 20.

Figure 6:
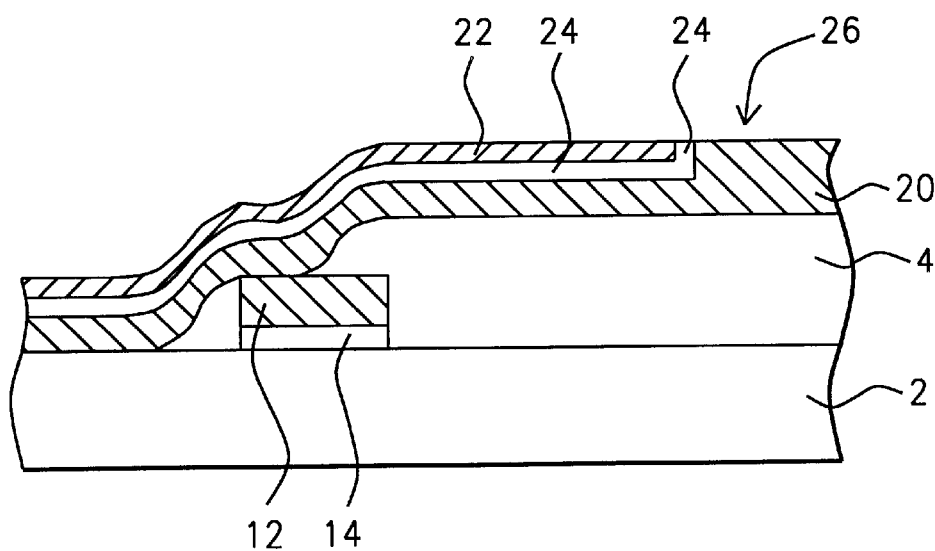

Referring now more particularly to FIG. 6, there is shown the result of subsequent conventional processing, in order to form a laterally disposed electrical contact 26 down to what is now a completed, high valued, polysilicon load resistor. Said electrical contact can be formed, for example, by means of a high implantation dose of N type dopant atoms such as arsenic. Said lower N type polysilicon region 20 is now a high resistance polysilicon line with an effective electrical thickness that is controlled by the depth of said upper P type polysilicon region 22 and said associated space charge region 24. It is noted that said space charge region 24 now extends up around the edge of said upper P type polysilicon region 22, in the vicinity of said laterally disposed contact region 26. It is also noted that the end portion of said upper P type silicon region 16, in the vicinity of said laterally disposed contact 26, has been converted from P type to N plus, by said high dose arsenic implantation step. Consequently, the electrical current path between said laterally disposed contact 26 and said underlying butted contacts to said underlying source drain region 10 and said underlying conductive polysilicon line 12, is by means of said lower N type polysilicon layer 20. In contrast electrical current cannot flow in said upper P type polysilicon region 22, due to the electrical isolation created by said space charge region 24.

The objects of the present invention have now been accomplished. As previously discussed, as the operating temperature of said completed polysilicon resistor is decreased, thermally activated grain boundary conduction will decrease and tend to cause an undesirably high negative TCR. However, said space charge region 24 will simultaneously decrease with the same reduction in temperature. Therefore, the effective electrical thickness and, consequently, the conduction of said completed polysilicon resistor will also tend to increase. The net result of these two competing thermally activated conduction mechanisms will be a highly desirable lessening in the degree of reduced electrical conduction for colder operating temperatures, relative to room temperature operation. Accordingly, the present invention has solved the problem of marginally inadequate cell currents for 4T SRAMs operating at cold temperatures.

While the invention has been particularly shown and described with reference to the preferred embodiments thereof, it will be understood by those skilled in the art that various changes in form and details may be made without departing from the spirit and scope of the invention:

What is claimed is:

1. A high resistance polysilicon device, formed over a semiconductor substrate, wherein the typical, undesirable, negative TCR behavior of polysilicon grain boundary conduction is substantially compensated by temperature dependent changes in the width of a novel vertical PN junction space charge region that has been formed along the entire length of said device.

2. The device of claim 1, wherein said vertical PN junction is in the form of upper and lower regions (portions) that are doped in such a manner as to exhibit opposite electrical conductivity behavior.

3. The device of claim 2, wherein the concentration of said doping of said upper and lower vertical PN junction regions (portions) is such that the doping of said upper region is substantially higher than that of said lower region.

4. The device of claim 2 wherein laterally disposed electrical contacts are only formed on said lower regions of said vertical PN junctions, thereby forcing said lower region of said vertical PN junctions to be the electrical current carrying path for said device.

* * * * *